(12) United States Patent
Wang

(10) Patent No.: US 11,391,649 B2
(45) Date of Patent: Jul. 19, 2022

(54) DRIVING EMULATION SYSTEM FOR AN AUTONOMOUS VEHICLE

(71) Applicant: Pony AI Inc., Grand Cayman (KY)

(72) Inventor: Jianan Wang, San Jose, CA (US)

(73) Assignee: Pony AI Inc., Grand Cayman (KY)

(*) Notice: Subject to any disclaimer, the term of this patent is extended or adjusted under 35 U.S.C. 154(b) by 411 days.

(21) Appl. No.: 16/562,307

(22) Filed: Sep. 5, 2019

(65) Prior Publication Data
US 2020/0378870 A1    Dec. 3, 2020

Related U.S. Application Data

(60) Provisional application No. 62/854,192, filed on May 29, 2019.

(51) Int. Cl.
*G01M 17/06* (2006.01)
*G05D 1/00* (2006.01)
*G06F 30/20* (2020.01)

(52) U.S. Cl.
CPC .......... *G01M 17/06* (2013.01); *G05D 1/0088* (2013.01); *G06F 30/20* (2020.01); *G05D 2201/0213* (2013.01)

(58) Field of Classification Search
CPC ...... G01M 17/06; G06F 30/20; G05D 1/0088; G05D 2201/0213
USPC ............................................................ 703/8
See application file for complete search history.

(56) References Cited

U.S. PATENT DOCUMENTS

| | | | |
|---|---|---|---|
| 5,513,990 A * | 5/1996 | Gluck | A63G 31/16 |
| | | | 472/60 |
| 10,785,474 B1 * | 9/2020 | Semansky | G05D 1/0246 |
| 2016/0082903 A1 * | 3/2016 | Haggerty | B60W 30/00 |
| | | | 701/23 |
| 2017/0262301 A1 * | 9/2017 | Bai | G06F 9/4411 |
| 2019/0047462 A1 * | 2/2019 | Vijayaraghavan | G05D 1/0088 |
| 2019/0113351 A1 * | 4/2019 | Antony | G01C 21/3461 |
| 2019/0204089 A1 * | 7/2019 | Rochan Meganathan | |
| | | | G06V 20/56 |
| 2019/0228571 A1 * | 7/2019 | Atsmon | G01C 11/04 |
| 2019/0258251 A1 * | 8/2019 | Ditty | G06V 20/58 |
| 2019/0295335 A1 * | 9/2019 | Amelunxen | G05D 1/0088 |

(Continued)

OTHER PUBLICATIONS

Davis et al. (Aerospace Vehicle Motion Emulation Using Omnidirectional Mobile Platform, AIAA, 2007, pp. 1-12) (Year: 2007).*

(Continued)

*Primary Examiner* — Iftekhar A Khan
(74) *Attorney, Agent, or Firm* — Sheppard Mullin Richter & Hampton LLP

(57) ABSTRACT

A method and a system for simulating driving operation of the autonomous vehicle are described. The method comprising initializing driving environment data using navigation information associated with the autonomous vehicle, and receiving control data from one or more sensors, wherein the control data affects driving operation of the autonomous vehicle. The method further comprises controlling the driving operation of the autonomous vehicle based on the driving environment data and the control data received, and directing movement of the movable platform on which the autonomous vehicle is placed, based on the driving operation of the vehicle controlled to emulate the movement of the autonomous vehicle.

20 Claims, 8 Drawing Sheets

(56) References Cited

U.S. PATENT DOCUMENTS

| | | | |
|---|---|---|---|
| 2019/0303759 A1* | 10/2019 | Farabet | G06F 9/455 |
| 2020/0001998 A1* | 1/2020 | Rao | B64C 39/024 |
| 2020/0025881 A1* | 1/2020 | Li | G01S 7/4812 |
| 2020/0378870 A1* | 12/2020 | Wang | G01M 17/007 |
| 2021/0109522 A1* | 4/2021 | Herse | B60R 16/02 |
| 2021/0134079 A1* | 5/2021 | Nee | G06V 20/10 |
| 2021/0255329 A1* | 8/2021 | Li | G01S 17/87 |
| 2021/0362953 A1* | 11/2021 | Schedlbauer | B65G 1/0492 |

OTHER PUBLICATIONS

Xu et al. (PaTAVTT: A Hardware-in-the-Loop Scaled Platform for Testing Autonomous Vehicle Trajectory Tracking, 2017, Hindawi Journal of Advanced Transportation, pp. 1-12) (Year: 2017).*

Negrut et al. (Autonomous Vehicles in the Cyberspace: Accelerating Testing via Computer Simulation, 2018, Society of Automotive Engineers, Inc, pp. 1-15) (Year: 2018).*

Monda et al. (Hardware Simulation of Relative Navigation using Visual Sensor Information, 2005, AIAA, pp. 1-14) (Year: 2005).*

* cited by examiner

DRIVING EMULATION SYSTEM FOR AN AUTONOMOUS VEHICLE

CROSS REFERENCE TO RELATED APPLICATIONS

This application claims the benefit under 35 U.S.C. § 119(e) of U.S. Provisional Application No. 62/854,192, filed May 29, 2019, the content of which is incorporated by reference in its entirety into the present disclosure.

BACKGROUND

Today many researchers are conducting research on autonomous driving, and autonomous driving has been rapidly developed accordingly. One technology of autonomous driving is virtual training of an autonomous vehicle. Virtual training provides an environment which is difficult to access in real time. Training the autonomous vehicle in the virtual traffic environment may be advantageous in cost, public safety, and time efficiency, compared to the training the autonomous vehicle driving operation in the real traffic environment. However, the difficulty in virtual training is to emulate actual movement of the autonomous vehicle especially driving, turning, and reversing in uphill, downhill, tilted road, and uneven surface.

These and other issues are addressed and/or resolved using techniques described herein. The foregoing examples of the related art and limitations related therewith are intended to be illustrative and not exclusive. Other limitations of the related art will become apparent to those of skill in the relevant art upon a reading of the specification and a study of the drawings.

SUMMARY

Described herein are a method and a system for emulate movement of an autonomous vehicle placed on a movable platform, which can be used for an autonomous driving operation by an autonomous vehicle. The system includes one or more processors; and a memory storing instructions that, when executed by the one or more processors.

In one embodiment, the disclosure describes a method for emulating movement of an autonomous vehicle placed on a movable platform. The method includes initializing driving environment data using navigation information associated with the autonomous vehicle, receiving control data from one or more sensors, wherein the control data affects driving operation of the autonomous vehicle, and controlling the driving operation of the autonomous vehicle based on the driving environment data and the control data received. The method further includes directing movement of the movable platform based on the driving operation of the vehicle controlled to emulate the movement of the autonomous vehicle.

In another embodiments, a system to emulate movement of an autonomous vehicle placed on a movable platform. The system includes a plurality of processors and a memory storing instructions that, when executed by the plurality of processors, cause the system to initialize driving environment data using navigation information associated with the autonomous vehicle, and receive control data from one or more sensors, wherein the control data affects driving operation of the autonomous vehicle. The system further controls the driving operation of the autonomous vehicle based on the driving environment data and the control data received and directs movement of the movable platform based on the driving operation of the vehicle controlled to emulate the movement of the autonomous vehicle.

In yet another embodiment, a non-transitory computer readable medium includes instructions that, when executed, cause one or more processors to perform initializing driving environment data using navigation information associated with the autonomous vehicle, receiving control data from one or more sensors, wherein the control data affects driving operation of the autonomous vehicle. The one or more processors further perform controlling the driving operation of the autonomous vehicle based on the driving environment data and the control data received and directing movement of the movable platform based on the driving operation of the vehicle controlled to emulate the movement of the autonomous vehicle.

A system of one or more computers can be configured to perform operations or actions by virtue of having software, firmware, hardware, or a combination of them installed on the system that in operation causes or cause the system to perform the actions. One or more computer programs can be configured to perform operations or actions by virtue of including instructions that, when executed by data processing apparatus, cause the apparatus to perform the actions. One general aspect includes a method for simulating a driving operation of an autonomous vehicle, the method including: initializing, by a processor of an autonomous driving system (ads) having a driving environment data using navigation information associated with the autonomous vehicle. The method also includes receiving, by the processor, control data from one or more sensors, where the control data affects driving operation of the autonomous vehicle. The method also includes controlling the driving operation of the autonomous vehicle based on the driving environment data and the control data received. The method also includes directing movement of a movable platform on which the autonomous vehicle is placed, based on the driving operation of the autonomous vehicle controlled to emulate the movement of the autonomous vehicle. Other embodiments of this aspect include corresponding computer systems, apparatus, and computer programs recorded on one or more computer storage devices, each configured to perform the actions of the methods.

Implementations may include one or more of the following features. The method further including updating the driving environment data with the movement of the movable platform to emulate the movement of the autonomous vehicle in real time. The method where initializing the driving environment data includes: pre-setting a GPS location of the autonomous vehicle; and simulating the driving environment data for the GPS location onto one or more display devices located around the autonomous vehicle. The method further including dynamically updating the GPS location based on the driving operation of the autonomous vehicle and a navigation information obtained from a high definition map of the autonomous vehicle. The method where the one or more sensors include image sensors capable of capturing the driving environment data rendered on the one or more display devices, where the driving environment data include geographical information associated with each GPS location of the autonomous vehicle. The method where the control data affecting the operation of the autonomous vehicle includes information of static and moving objects/obstacle, road surface conditions, traffic signal information, and other related data. The method where controlling the driving operation of the autonomous vehicle includes varying at least one of a speed and a direction of movement of the autonomous vehicle based on the driving environment data and the control data. The method where directing the movement of the movable platform includes: detecting at least one of a varied speed and direction of movement of the autonomous vehicle.

The method may also include actuating the movement of the movable platform based on the detected at least one of speed and a direction of movement of the autonomous vehicle. The method may also include where the direction of movement of the autonomous vehicle includes linear and angular direction movement of the autonomous vehicle, where the linear direction movement is one of forward and reverse direction movement, and angular direction movement includes one of uphill, downhill, tilted direction movement. The method where the movable platform includes a base platform and a plurality of flexible legs coupled to the base platform, where the base platform and the plurality of flexible legs are capable of moving in accordance with a detected at least one of speed and direction of movement of the autonomous vehicle. Implementations of the described techniques may include hardware, a method or process, or computer software on a computer-accessible medium.

One general aspect includes a system to emulate movement of an autonomous vehicle placed on a movable platform, the system includes: a plurality of processors; and a memory storing instructions that, when executed by the plurality of processors, cause the system to perform: the following steps: initialize a driving environment data using navigation information associated with the autonomous vehicle. The system also includes receive control data from one or more sensors, where the control data affects driving operation of the autonomous vehicle. The system also includes control a driving operation of the autonomous vehicle based on the driving environment data and the control data received. The system also includes direct movement of the movable platform on which the autonomous vehicle is placed, based on the driving operation of the vehicle controlled to emulate the movement of the autonomous vehicle. Other embodiments of this aspect include corresponding computer systems, apparatus, and computer programs recorded on one or more computer storage devices, each configured to perform the actions of the methods.

Implementations may include one or more of the following features. The system further includes update the driving environment data with the movement of the movable platform to emulate the movement of the autonomous vehicle. The system where initializing the driving environment data includes: pre-set a global positioning system (GPS) location of the autonomous vehicle; and emulate the driving environment data for the GPS location onto one or more display devices located around the autonomous vehicle. The system further includes dynamically update the GPS location based on the driving operation of the autonomous vehicle and navigation information obtained from a high definition map of the autonomous vehicle. The system where the one or more sensors include image sensors capable of capturing the driving environment data rendered on the one or more display devices, where the driving environment data include geographical information associated with each GPS location of the autonomous vehicle. The system where the control data that affects the operation of the autonomous vehicle includes information of static and moving objects/obstacle, road surface conditions, traffic signal information, and other related data. The system where controlling the driving operation of the autonomous vehicle includes vary at least one of a speed and a direction of movement of the autonomous vehicle based on the driving environment data and the control data. The system where direct the movement of the movable platform includes: detect at least one of a varied speed and direction of movement of the autonomous vehicle; and actuate the movement of the movable platform based on the detected at least one of speed and a direction of movement of the autonomous vehicle, where the direction of movement of the autonomous vehicle includes linear and angular direction movement of the autonomous vehicle, where the linear direction movement is one of forward and reverse direction movement, and angular direction movement includes one of uphill, downhill, tilted direction movement.

The system where the movable platform includes a base platform and a plurality of flexible legs coupled to the base platform, where the base platform and the plurality of flexible legs can move in accordance with a detected at least one of speed and direction of movement of the autonomous vehicle. Implementations of the described techniques may include hardware, a method or process, or computer software on a computer-accessible medium.

One general aspect includes a non-transitory computer readable medium including instructions that, when executed, cause one or more processors to perform: initializing a driving environment data using navigation information associated with an autonomous vehicle; receiving control data from one or more sensors, where the control data affects driving operation of the autonomous vehicle; controlling a driving operation of the autonomous vehicle based on the driving environment data and the control data received; and directing movement of a movable platform on which the autonomous vehicle is placed, based on the driving operation of the autonomous vehicle controlled to emulate the movement of the autonomous vehicle. Other embodiments of this aspect include corresponding computer systems, apparatus, and computer programs recorded on one or more computer storage devices, each configured to perform the actions of the methods.

Implementations may include one or more of the following features. The non-transitory computer readable medium further includes updating the driving environment data with the movement of the movable platform to emulate the movement of the autonomous vehicle in real time. Implementations of the described techniques may include hardware, a method or process, or computer software on a computer-accessible medium.

BRIEF DESCRIPTION OF THE DRAWINGS

Certain features of various embodiments of the present technology are set forth with particularity in the appended claims. A better understanding of the features and advantages of the technology will be obtained by reference to the following detailed description that sets forth illustrative embodiments, in which the principles of the disclosure are utilized, and the accompanying drawings of which:

DETAILED DESCRIPTION

Figure 1:
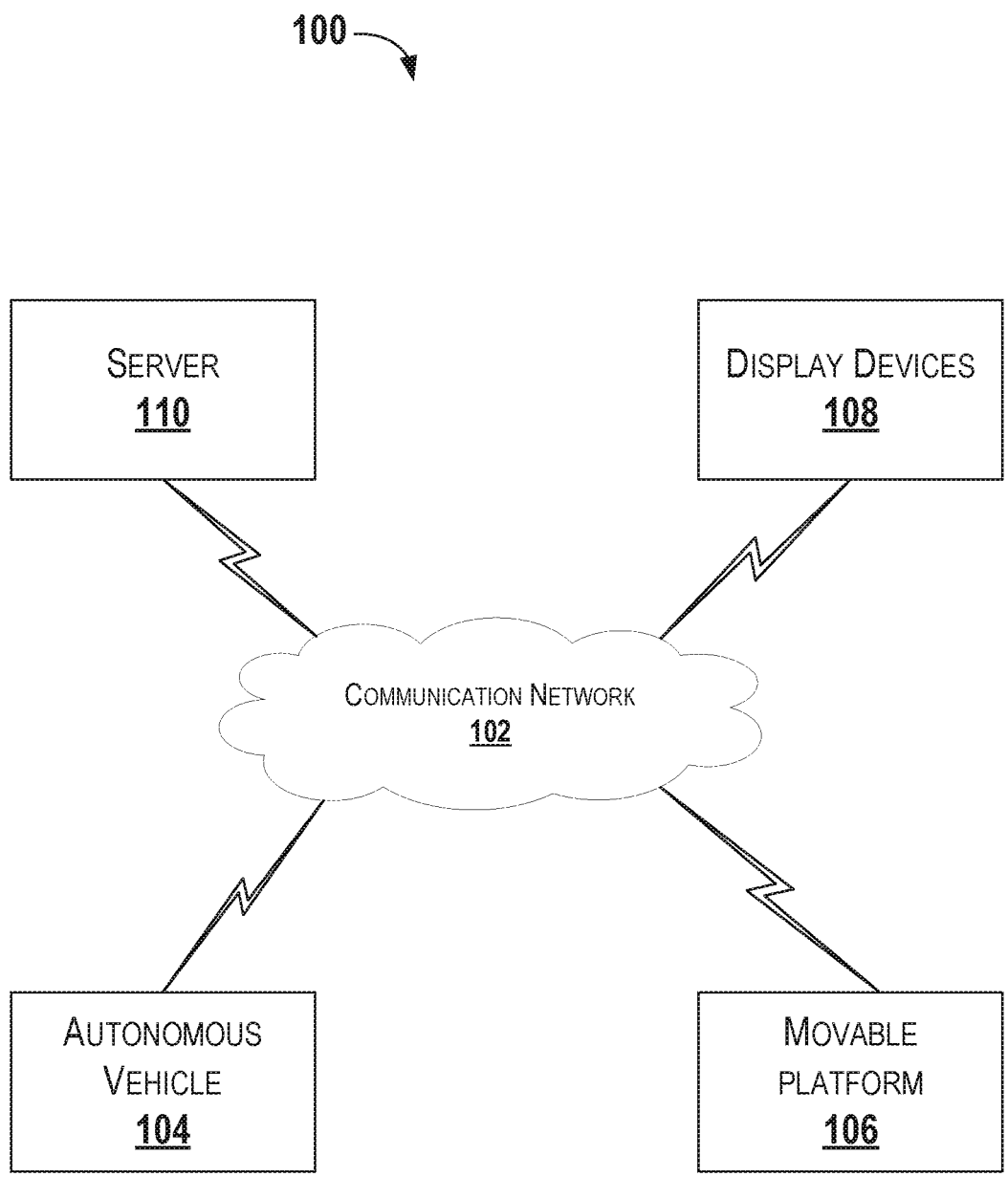
FIG. 1 is a schematic diagram depicting an exemplary system for training an autonomous vehicle according to some embodiments of the present disclosure.

Training autonomous vehicle may be conducted using an emulated or emulated environment. In various embodiments' the emulated environment may be used to repeatedly and safely train the artificial intelligence computers of an autonomous vehicle computer system its processes and procedures to avoid real time incidents. Challenges remain in training autonomous vehicles in an emulated environment since these vehicles are guided by high definition maps and GPS location. Embodiments are directed to addressing these and other challenges.

Virtual training with an emulation system may be faster since the systems may run uninterrupted for hours. More importantly, virtual training can provide environments that may otherwise be difficult to access. For instance, to train the autonomous vehicle to drive well in an area like San Francisco, the training needs to take place in an area with hills, which may not be available. Various locations and scenarios can be emulated in an emulation system. For example, displays or screens can be erected around a test car showing street boundaries and traffic signs so that the sensors and cameras on the autonomous vehicle may detect that the vehicle is at a different location and driving on the streets while being on a simulator.

Driving emulation system may include a Global Positioning System (GPS), LiDAR and Radar, one or more camera, high definition map. The environment of the emulator may include a high definition map is used to direct the operations of the treadmill platform, traffic lights projected on screens erected around the car (or perhaps above and below the car too; creating 360 degrees view for the car). The emulation system may further includes showing obstacles, pedestrians projected on one or more screens. The treadmill may be operated according to information from high precision map and the driving operation of the autonomous vehicle. Speed and moving direction of the treadmill is determined to counteract the driving operations of the vehicle. However, the vehicle drives the treadmill keeps the car in the same place (or within a small area). In some embodiments, tilting of the treadmill is determined by the map, to simulate the real environment for incline, decline or a banked curve, etc. The surface of the treadmill can have movable portions to simulate bumps and dips.

The environment may be initiated before the car starts to move. The vehicle and the treadmill may be preset to a GPS location for the vehicle. Based on the initial GPS location, the vehicle may be placed on a map. In other embodiments, the system may choose a location on the map, and then give the car the GPS location information. The vehicle's GPS unit (not actually receiving GPS signals) may determine virtual GPS information based on original GPS location before the vehicle moves, and movement of the vehicle. The movement of the vehicle can be calculated by speed and direction of the movement. Movement of the car can also be determined by the operation of the treadmill.

In various embodiments a change of the GPS location determines the location of the vehicle in the map, which determines driving environment (e.g., road condition, traffic signs, turns). The vehicle is operated by the autonomous driving program, which receives input from the map, visual signals received by the camera (projected on the screens), and possibly LiDAR/Radar signals.

Determining distances from virtual signs and virtual objects may be challenging for an autonomous vehicle in an emulated environment. The autonomous vehicle may use the size of the object. In other embodiment, the vehicle may recognize the object, for example, a Toyota, the projected size on screen vs. the actual size of a real Toyota. The vehicle may have multiple cameras taking different images to create the images used for simulation, which provides a level of three-dimensional perspective.

Since the emulated environment may not have real objects, the LiDAR and radar systems of the autonomous vehicles may find it challenging to operate the autonomous vehicle. The LiDAR and radar systems usually require physical objects to bounce of signals. Perhaps some objects can be thrown into the simulation room, mimicking objects (pedestrians, animals, falling trees etc.)

In some embodiments, the driving environment may be created by another vehicle with sensors and cameras driving in the real environment taking pictures/videos of the surroundings from the street. The sensor data and camera data may be displayed by the driving environment. The driving environment can also take objects spiked into the images—adding some rare events (e.g., police car driving in wrong directions) to create challenges for training.

In some embodiments, the GPS information provided to the autonomous vehicle can also be emulated. For example, the autonomous vehicle may receive an initialization GPS location, which can be updated based on the virtual direction and distance driven by the vehicle. It may be difficult to emulate is actual movement (horizontal and vertical) of the car—driving, turning, reversing, uphill, downhill, tilted road, uneven surface. The autonomous vehicle can be placed on a treadmill, which allows the vehicle to actually move. The treadmill can be operated according to information from high precision map and the driving operation of the car. Speed and moving direction of the treadmill is dictated by the driving of the car. However, the vehicle drives, the treadmill keeps the vehicle in the same place (or within a small area).

In the following description, certain specific details are set forth in order to provide a thorough understanding of various embodiments of the disclosure. However, one skilled in the art will understand that the disclosure may be practiced without these details. Moreover, while various embodiments of the disclosure are disclosed herein, many adaptations and modifications may be made within the scope of the disclosure in accordance with the common general knowledge of those skilled in this art. Such modifications include the substitution of known equivalents for any aspect of the disclosure in order to achieve the same result in substantially the same way.

Unless the context requires otherwise, throughout the present specification and claims, the word "comprise" and variations thereof, such as, "comprises" and "comprising" are to be construed in an open, inclusive sense, that is as "including, but not limited to." Recitation of numeric ranges of values throughout the specification is intended to serve as a shorthand notation of referring individually to each separate value falling within the range inclusive of the values defining the range, and each separate value is incorporated in the specification as it were individually recited herein. Additionally, the singular forms "a," "an" and "the" include plural.

Reference throughout this specification to "one embodiment" or "an embodiment" means that a feature, structure or characteristic described in connection with the embodiment is included in at least one embodiment of the present disclosure. Thus, the appearance of phrases "in one embodiment", "in an embodiment", "in some embodiment" or "in various embodiment" in various places throughout this specification are not necessarily all referring to the same embodiment but may be in some instances. Furthermore, the features, structures, or characteristics may be combined in any suitable manner in one or more embodiments.

Various embodiments described herein are directed to a method and a system for training an autonomous vehicle by simulating movement of the autonomous vehicle using a movable platform. In various embodiments, a method and a system for emulating movement of an autonomous vehicle placed on a movable platform is disclosed. The method includes initializing driving environment data using navigation information associated with the autonomous vehicle, and receiving control data from one or more sensors, wherein the control data affects driving operation of the autonomous vehicle. The method further includes controlling the driving operation of the autonomous vehicle based on the driving environment data and the control data received and directing movement of the movable platform based on the driving operation of the vehicle controlled to emulate the movement of the autonomous vehicle.

FIG. 1 is a schematic diagram depicting an example of a system 100 for training an autonomous vehicle according to some embodiments. In the example depicted in FIG. 1, the system 100 includes a communication network 102, an autonomous vehicle 104, a movable platform 106, one or more display devices 108 and server 110 connected via the communication network 102.

In the example depicted in FIG. 1, the system 100 for training the autonomous vehicle 104 represents a system primarily dedicated to train the autonomous vehicle 104 mountable on the movable platform 106, which is capable of sensing surrounding environment and navigating with a limited human input or without human input. The autonomous vehicle may typically include a vehicle that drives on the ground, such as wheeled vehicles, and may also include a vehicle that flies in the sky (e.g., drones, helicopter, airplanes, and so on). The autonomous vehicle referred in the forthcoming paragraphs may or may not accommodate one or more passengers therein.

In various embodiment, the autonomous vehicle 104 includes a vehicle that controls braking and/or acceleration without real time human input. In another embodiment, the autonomous vehicle 104 includes a vehicle that controls steering without real time human input based on inputs from one or more sensors or lens mount units. In yet another embodiment, the autonomous vehicle 104 includes a vehicle that autonomously controls braking, acceleration, and steering without real time human input.

In some embodiments, the autonomous vehicle 104 is capable of sensing surrounding environment based on inputs from one or more sensors or imaging devices (e.g., camera) mounted on the autonomous vehicle 104. In some embodiments, the autonomous vehicle 104 is configured to analyze image data obtained from the one or more imaging devices and identify objects (e.g., traffic signals, road signs, other vehicles, pedestrians, and obstacles) included in images of the analyzed image data. In some embodiments, the autonomous vehicle 104 is also capable of performing an autonomous-driving operation based on the identified objects. In other embodiments, the autonomous vehicle 104 is also capable of following a traffic stream while driving without hitting the identified objects. For example, the autonomous vehicle 104 follows traffic signals identified based on image data, follows traffic signs identified based on image data, and maintains a safe distance based on the speed of the preceding vehicles.

In the example of FIG. 1, the autonomous vehicle 104 is also capable of communicating with systems or devices connected to the autonomous vehicle 104 through the communication network 102. In some embodiments, the autonomous vehicle 104 communicates with a server 110 via the communication network 102. For example, the autonomous vehicle 104 may receive from the server map information (e.g., local map, parking structure map, floor plan of buildings, and etc.) of a region around the autonomous vehicle 104. In another example, the autonomous vehicle 104 periodically provides information, such as but not limited to location and direction to the server 110.

In some embodiments, the movable platform 106 includes a base platform and a plurality of flexible legs coupled to the base platform. Each of the plurality of flexible legs are capable of moving independent of another along with the base platform to emulate any movement of the movable platform 106. In various embodiments, the base platform and the plurality of flexible legs are capable of moving in accordance with the detected at least one of speed and direction of movement of the autonomous vehicle 104 placed on the movable platform 106. The movable platform 106 includes one or more treadmills that emulate forward, left, right and reverse movement of the autonomous vehicle 104.

In one embodiment, the one or more display devices 108 display environment data using the navigation information obtained from the autonomous vehicle 104. In one example, the environment data includes street boundaries, traffic signal information and any objects or obstacles identified in the road surface, and road surface conditions such as bumps, dips and other conditions. The one or more display devices 108 receive the navigation information from the autonomous vehicle 104 via the communication network 102.

In some embodiments, the communication network 102 represents a variety of potentially applicable technologies. For example, the communication network 102 can be used to form a network or part of a larger network. Components that are disclosed as separate components may be co-located on a device, the network can include a bus or other data conduit or plane. Depending upon implementation-specific or other considerations, the communication network 102 can include wired communication interfaces and wireless communication interfaces for communicating over wired or wireless communication channels. Where a first component is located on a first device and a second component is located on a second (different) device, the communication network 102 can include a wireless or wired back-end network or LAN. The communication network 102 can also encompass a relevant portion of a WAN or other network, if applicable. Enterprise networks can include geographically distributed LANs coupled across WAN segments. For example, a distributed enterprise network can include multiple LANs (each LAN is sometimes referred to as a Basic Service Set (BSS) per IEEE 802.11, though no explicit requirement is suggested here) separated by WAN segments. An enterprise network can also use VLAN tunneling (the connected LANs are sometimes referred to as an Extended Service Set (ESS) in IEEE 802.11 parlance, though no explicit requirement is suggested here). Depending upon implementation or other considerations, the communication network 102 can include a private cloud under the control of an enterprise or third party, or a public cloud.

The autonomous vehicle 104 may communicate with one or more other autonomous vehicle systems via the communication network 102. For example, the autonomous vehicle 104 sends the navigation information of the corresponding autonomous vehicle to the one or more other autonomous vehicle systems, such that traffic incidents such as collisions can be prevented. In another example, the autonomous vehicle 104 commands one or more other autonomous-driving police systems to proceed to a particular location to avoid traffic incidents.

In various embodiments, the systems and method described here may be configured to receive external environmental data from a car that has actually driven on the street at an earlier time than the emulation with the autonomous vehicle 104. In various embodiments, after monitoring the performance of the autonomous vehicle from the receiving environmental data, the learnings or performance parameters from the autonomous vehicle for the same environmental data may be used to repeatedly train the autonomous vehicle 104. Accordingly, an artificial intelligence system may additionally be included in the autonomous vehicle 104 that allows the autonomous vehicle to learn from previous performances and improve upon the previous performance based on the performance parameters. In other embodiments, the performance parameters may include time from a location to another location, emotional state of the occupants, rating by the occupants and/or improvisation by the autonomous vehicle 104.

Figure 2A:
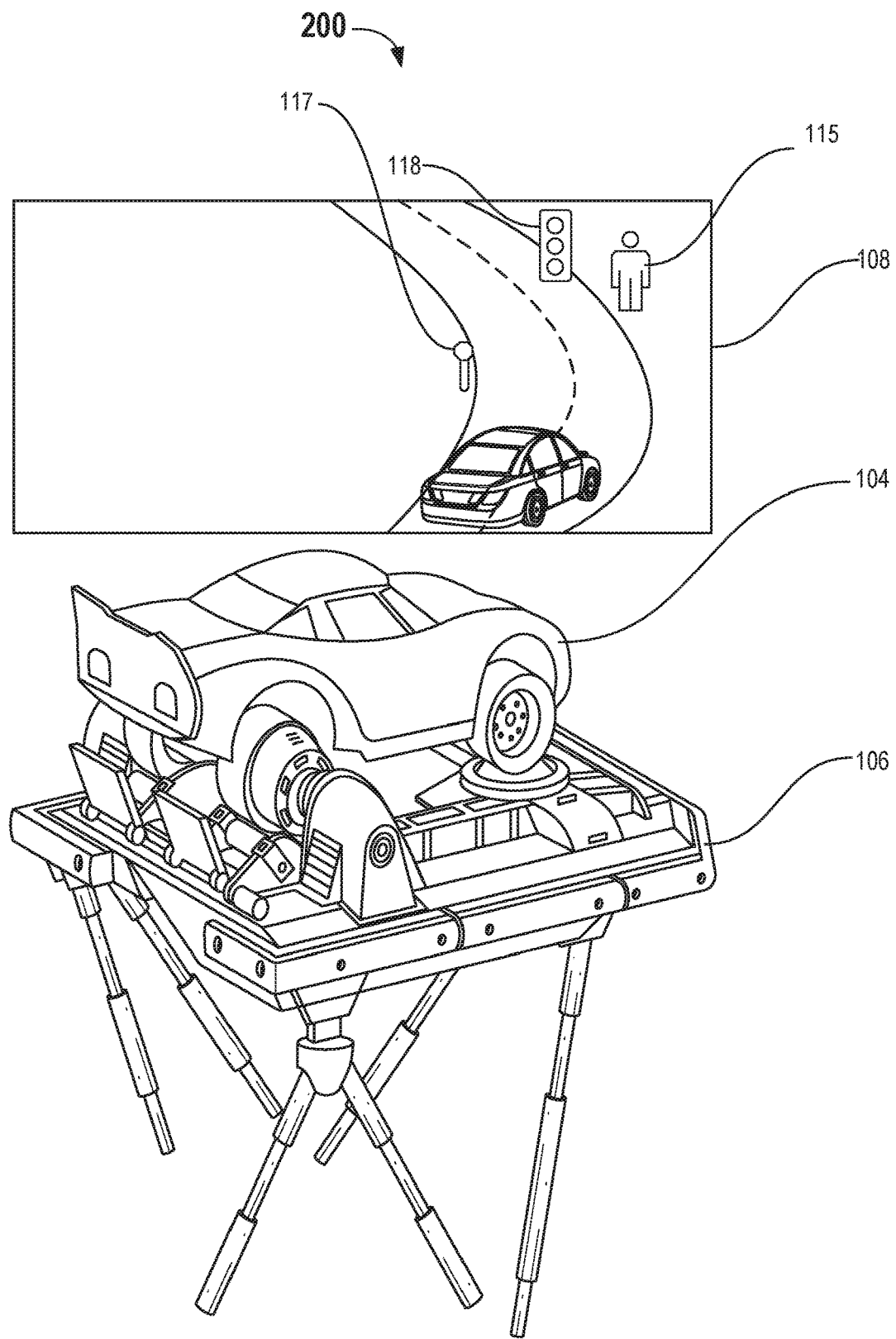
FIG. 2A illustrates an exemplary emulation environment for training an autonomous vehicle according to some embodiments of the present disclosure.

FIG. 2A illustrates an exemplary emulation environment 200 for training an autonomous vehicle according to some embodiments. In the example depicted in FIG. 2A, the system 100 for training an autonomous vehicle includes an autonomous vehicle 104 mounted on the movable platform 106, and the one or more display devices 108.

In one embodiment, the autonomous vehicle 104 includes a global positioning system (GPS), a plurality of sensors, a high definition map, a processor, and a memory. For example, the plurality of sensors may be imaging devices such as camera, a LiDAR and/or Radar. In one embodiment, the autonomous vehicle 104 is capable of sensing the surrounding environment based on inputs from the plurality of cameras mounted on the autonomous vehicle 104. The processor of the autonomous vehicle 104 receives input image data from the plurality of cameras and analyzes the image data to identify objects included in images of the analyzed image data. Objects may include for example, traffic signals, road signs, other vehicles, pedestrians, road surface conditions, and obstacles. In one embodiment, the autonomous vehicle 104 is also capable of performing an autonomous-driving operation based on the identified objects. In one embodiment, the autonomous vehicle 104 include a plurality of processors.

The processor of the autonomous vehicle 104 is configured to initialize driving environment data using navigation information received from the high definition map. In one embodiment, the processor initializes the driving environment data by pre-setting a global positioning system (GPS) location of the autonomous vehicle 104 and simulating the driving environment data for the pre-set GPS location onto the one or more display devices 108 around the autonomous vehicle 104. The processor is further configured to receive control data affecting the driving operation of the autonomous vehicle 104 from a plurality of cameras and the LiDAR and/or Radar. Each of the plurality of cameras is configured to capture information from one or more display devices 108 erected around the autonomous vehicle 104 showing traffic signals, road signs, other vehicles, pedestrians, and obstacles. Based on the control data received, the driving operation of the autonomous vehicle 104 is controlled.

In one embodiment, the processor of the autonomous vehicle 104 is configured to control the driving operation of the autonomous vehicle 104 based on the driving environment data and the control data received from the plurality of cameras. Further, the processor of the autonomous vehicle 104 is configured to direct movement of the movable platform 106 based on the controlled driving operation of the autonomous vehicle 104. The processor also continuously updates the driving environment data with the movement of the movable platform 106 to emulate the movement of the autonomous vehicle 104 in real time. In one embodiment, the processor directs the movement of the movable platform 106 by detecting at least one of a varied speed and direction of movement of the autonomous vehicle 104 and actuating the movement of the movable platform 106 based on the detected at least one of speed and direction of movement of the autonomous vehicle 104. In some embodiments, the direction of movement of the autonomous vehicle 104 includes at least one of forward and reverse direction movement and one of uphill, downhill, left and right directional movements.

In an embodiment, the movable platform 106 includes a base platform and a plurality of flexible legs coupled to the base platform. The base platform and the plurality of flexible legs are capable of moving in accordance with the detected at least one of speed and direction of movement of the autonomous vehicle 104. The base platform and the plurality of flexible legs are coupled such that any one of the flexible legs can move independent of another when directed by the processor of the movable platform 106.

In various embodiments, the movable platform 106 includes one or more engaging structures or rods on the sides to engage with the wheels of the autonomous vehicle. The plurality of flexible legs is capable of moving in accordance with the detected at least one of speed and direction of movement of the wheels of the autonomous vehicle 104. In one embodiment, the elongated structures or rods include a holding means to retain the autonomous vehicle 104 within the movable platform 106. Holding means, may be for example, girdle or belt tied to the elongated structures and the autonomous vehicle 104. In another embodiment, the movable platform 106 includes the belt that moves in a direction opposite to the direction of movement of wheels of the autonomous vehicle 104 to keep the autonomous vehicle 104 in the same place. In yet another embodiment, the movable platform 106 includes a movable portion to emulate bumps and dips of the road surface conditions.

As shown in the one or more display devices 108, a car in the path of the autonomous vehicle 104 may be displayed. Additionally, the autonomous vehicle 104 may be provided details regarding the objects that are shown. Objects that are shown, such as but not limited to, a pedestrian 115, a street signage 117, a signal light 118. In various embodiments, the one or more display devices 108 may be split into multiple displays so that an autonomous vehicle 104 may be able to detect and compensate for the detected objects.

Figure 2B:
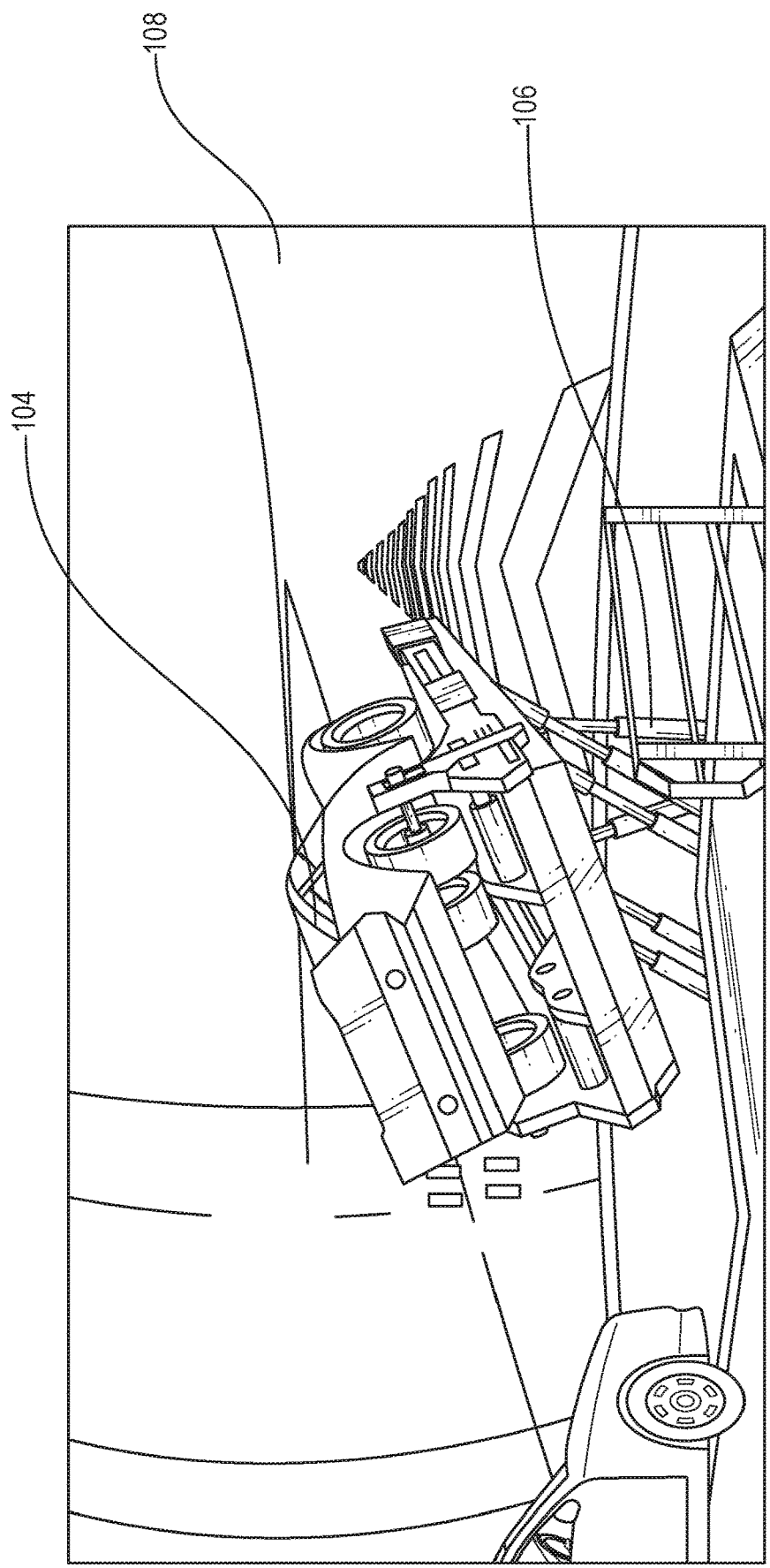
FIG. 2B illustrates another exemplary emulation environment for training an autonomous vehicle of FIG. 2A according to some embodiments of the present disclosure.

FIG. 2B illustrates another exemplary emulation environment for training an autonomous vehicle of FIG. 2A. As shown in FIG. 2B, the one or more display devices 108 display environment data for the current GPS location using the navigation information obtained from the autonomous vehicle 104. In one example, the environment data includes street boundaries, traffic signal information and any objects or obstacles identified in the road surface, and road surface conditions such as bumps, dips and other conditions. The one or more display devices 108 receive the navigation information from the autonomous vehicle 104 via the communication network 102 to emulate an environment for training the autonomous vehicle 104. In one embodiment, the one or more display devices 108 display environment data based on the updated driving operation of the autonomous vehicle 104.

As shown in FIG. 2B, the autonomous vehicle 104 is shown as negotiating a turn displayed on the one or more display devices 108. Although the FIGS. 2A through 3B show a single display device, other smaller or larger display devices may be included as part of the emulation environments. In other embodiments, the one or more display devices may be placed on a track and moved along the track so that the autonomous vehicle 104 sensors and cameras may detect movement of an object along the travel.

Figure 3A:
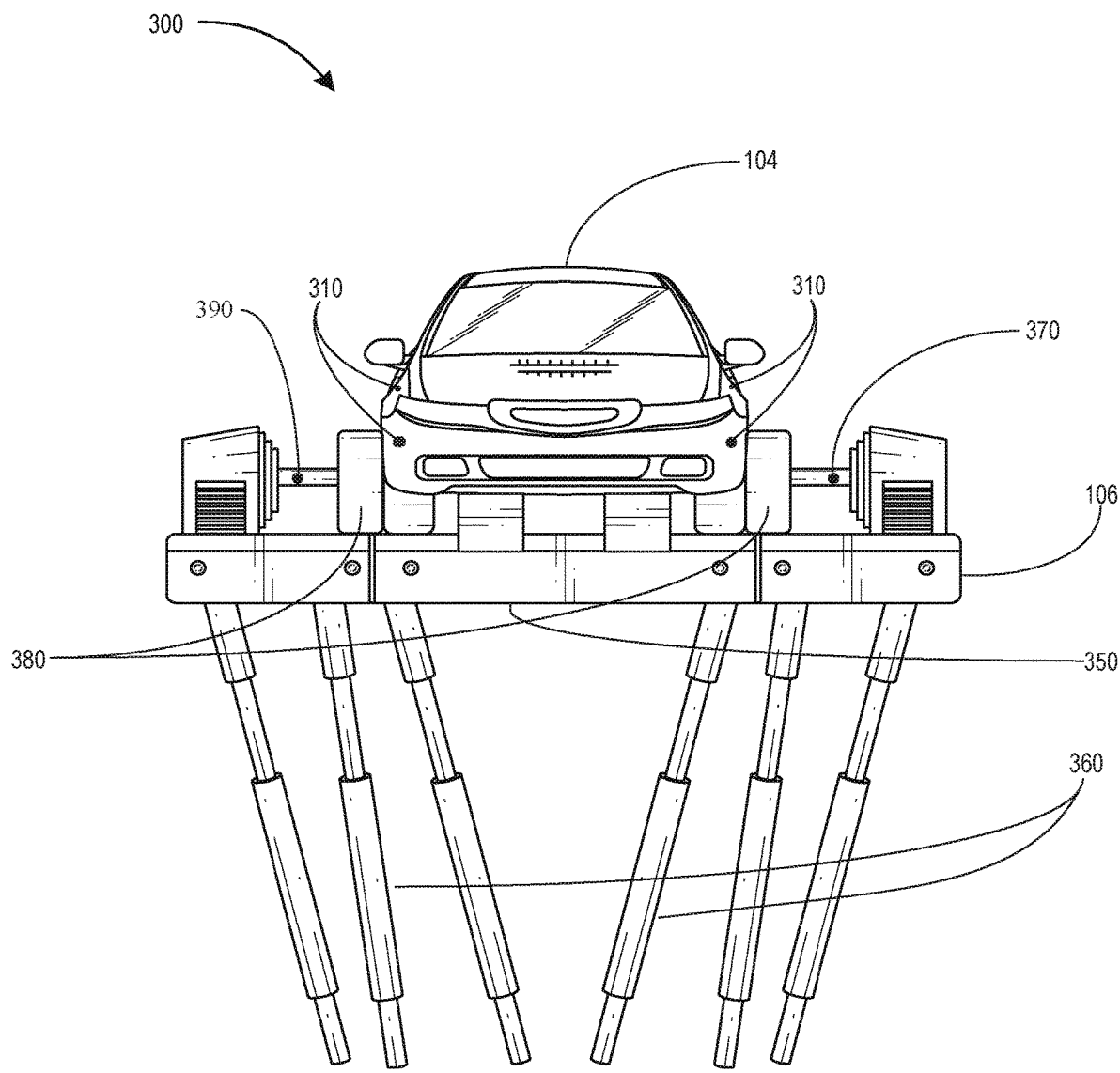
FIG. 3A illustrates an exemplary emulation environment for autonomous vehicle mounted on a movable platform according to some embodiments of the present disclosure.

FIG. 3A illustrates another exemplary simulation environment 300 for training an autonomous vehicle 104 mounted on a movable platform 106 according to some embodiments. As shown in FIG. 3A, the autonomous vehicle 104 can detect the surrounding environment based on inputs from a plurality of cameras 310 mounted on the autonomous vehicle 104. In various embodiments, the processor of the autonomous vehicle 104 is configured to analyze image data obtained from the plurality of cameras 310, identify objects included in images of the analyzed image data, and perform an autonomous driving operation based on the identified objects. The movable platform 106 includes a base platform 350 and a plurality of flexible legs 360 coupled to the base platform 350. Each of the plurality of flexible legs 360 are capable of moving independently of another leg along with the base platform 350 to emulate any movement of the movable platform 106. The movable platform 106 further includes one or more elongated structures or rods 370 on one or more sides to engage with wheels 380 of the autonomous vehicle 104. Each of the plurality of flexible legs 360 is capable of moving in accordance with the at least one of speed and direction of movement of the wheels 380 the autonomous vehicle 104 from detected by the plurality of sensor 390 output placed on the elongated rods 370 of the movable platform 106. In one embodiment, the movable platform 106 may include a treadmill.

Figure 3B:
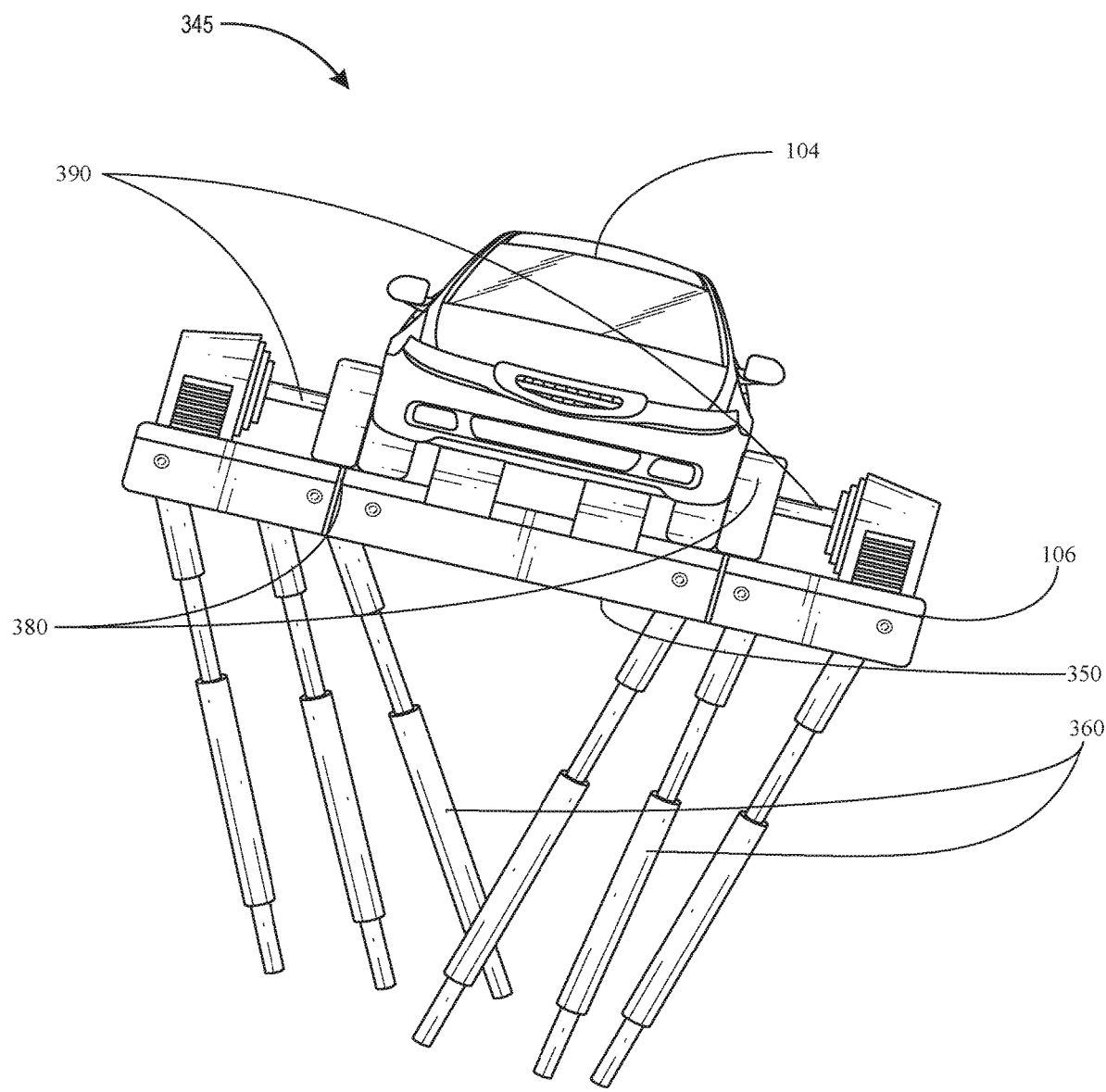
FIG. 3B illustrates an exemplary emulation environment for autonomous vehicle mounted on the movable platform of FIG. 3A when the autonomous vehicle is taking turn according to some embodiments of the present disclosure.

FIG. 3B illustrates another exemplary simulation environment 345 for training an autonomous vehicle mounted on the movable platform. As shown in FIG. 3B, the autonomous vehicle 104 is capable of sensing the surrounding environment based on inputs from a plurality of cameras 310 or sensors mounted on the autonomous vehicle 104. In some embodiments, the processor of the autonomous vehicle 104 is configured to analyze image data obtained from the plurality of cameras 310, identify objects included in images of the analyzed image data, and perform an autonomous driving operation of turning the wheels 380 of the autonomous vehicle 104 based on the identified objects. Each of the plurality of flexible legs 360 of the movable platform 106 is capable of moving based on the direction of movement of the wheels 380 and the autonomous vehicle 104 as detected by the plurality of sensor 390 output placed on the elongated rods 370 of the movable platform 106.

Figure 4:
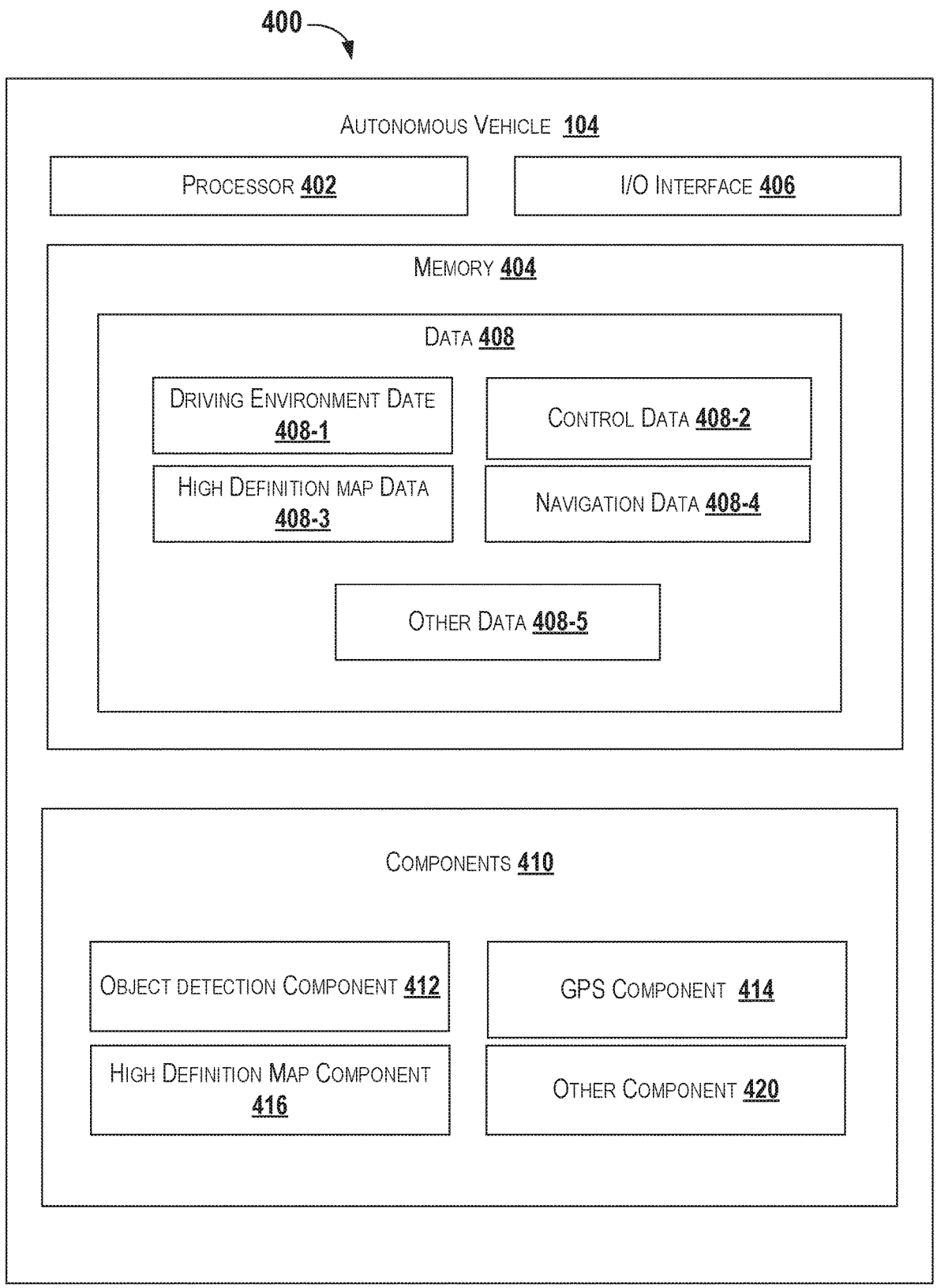
FIG. 4 is an exemplary block diagram illustrating various components of an autonomous vehicle of FIG. 1 in accordance with an embodiment of the present disclosure.

FIG. 4 is an exemplary block diagram 400 illustrating various components of an autonomous vehicle 104 of FIG. 1 in accordance with an embodiment of the present disclosure. The autonomous vehicle 104 includes one or more components coupled with each other that may be deployed on a single system or on different systems. In one embodiment, the autonomous vehicle 104 may be a autonomous vehicle as illustrated in FIG. 2. The autonomous vehicle includes a processor 402, a memory 404, I/O interface 406, an object detection component 412, a (Global Positioning System) GPS component 414, and a high definition map component 416.

The autonomous vehicle 104 further includes data 408 and components 410. In one implementation, the data 408 may be stored within the memory 404. The data 408 include driving environment data 408-1, control data 408-2, high definition map 408-3, navigation data 408-4 and other data 408-5. In some embodiments, the data 408 may be stored in the memory 404 in the form of various data structures. Additionally, the aforementioned data can be organized using data models, such as relational or hierarchical data models. The other data may store data, including temporary data, temporary files, and co-ordinate databases generated by the components 410 for performing the various functions of the autonomous vehicle 104.

The modules may include, for example, the object detection component 412, the GPS module, the high definition map component 416, and other components 420. The components 410 may also include other component 420 to perform various miscellaneous functionalities of the autonomous vehicle 104. It will be appreciated that such aforementioned modules may be represented as a single module or a combination of different modules. The components 410 may be implemented in the form of software, hardware and/or firmware. As used herein, the term modules refer to an application specific integrated circuit (ASIC), an electronic circuit, a processor (shared, dedicated, or group) and memory that execute one or more software or firmware programs, a combinational logic circuit, and/or other suitable components that provide the described functionality.

The high definition map component 416 is configured to provide navigation information for the autonomous vehicle 104. In some embodiments, the high definition map component 416 provides high definition maps with high precision and up-to-date map data to the autonomous vehicle 104 for safe navigation. During the use of the high definition map component 416, the movable platform 106 computer system may provide high definition map component 416 of the autonomous vehicle 104 with GPS location information at initialization for training purposes.

The object detection component 412 includes a plurality of cameras, sensors, LiDAR, and RADAR sensors. The object detection component 412 is configured to received information from one or more display devices 108 erected around the autonomous vehicle 104 to detect objects like traffic signals, road signs, other vehicles, pedestrians, and obstacles.

The GPS component 414 is configured to preset a GPS location for the autonomous vehicle 104 during initialization of the driving environment data. Further, the GPS component 414 is configured to dynamically update the GPS location based on the driving operation of the autonomous vehicle 104 and navigation information obtained from the high definition map of the autonomous vehicle 104.

In operation, the processor 402 of autonomous vehicle 104 is configured to initialize driving environment data using navigation information received from the high definition map component 416. In one embodiment, the autonomous vehicle 104 initializes the driving environment data by pre-setting a global positioning system (GPS) location of the autonomous vehicle 104 and simulating the driving environment data for the pre-set GPS location onto one or more display devices 108 around the autonomous vehicle 104. The processor 402 is further configured to receive control data affecting the driving operation of the autonomous vehicle 104 from the object detection component 412. The object detection component 412 is configured to receive information from the one or more display devices 108 that are configured to show traffic signals, road signs, other vehicles, pedestrians, and obstacles.

In one embodiment, the processor 402 of the autonomous vehicle 104 is configured to control the driving operation of the autonomous vehicle 104 based on the driving environment data and the control data that was received. In various embodiments, the processor 402 of the autonomous vehicle 104 is configured to direct movement of the movable platform 106 based on the controlled driving operation of the autonomous vehicle 104. The processor 402 of the autonomous vehicle 104 continuously updates the driving environment data with the movement of the movable platform 106 to emulate the movement of the autonomous vehicle 104 in real time.

Thus, the present disclosure emulates the movement of the autonomous vehicle 104 in real time to train the autonomous vehicle driving operation in the real traffic environment. Further, simulating the movement of the autonomous vehicle 104 in the virtual traffic environment is advantageous in cost, public safety and time efficiency, compared to the training the autonomous vehicle 104 driving operation in the real traffic environment.

Figure 5:
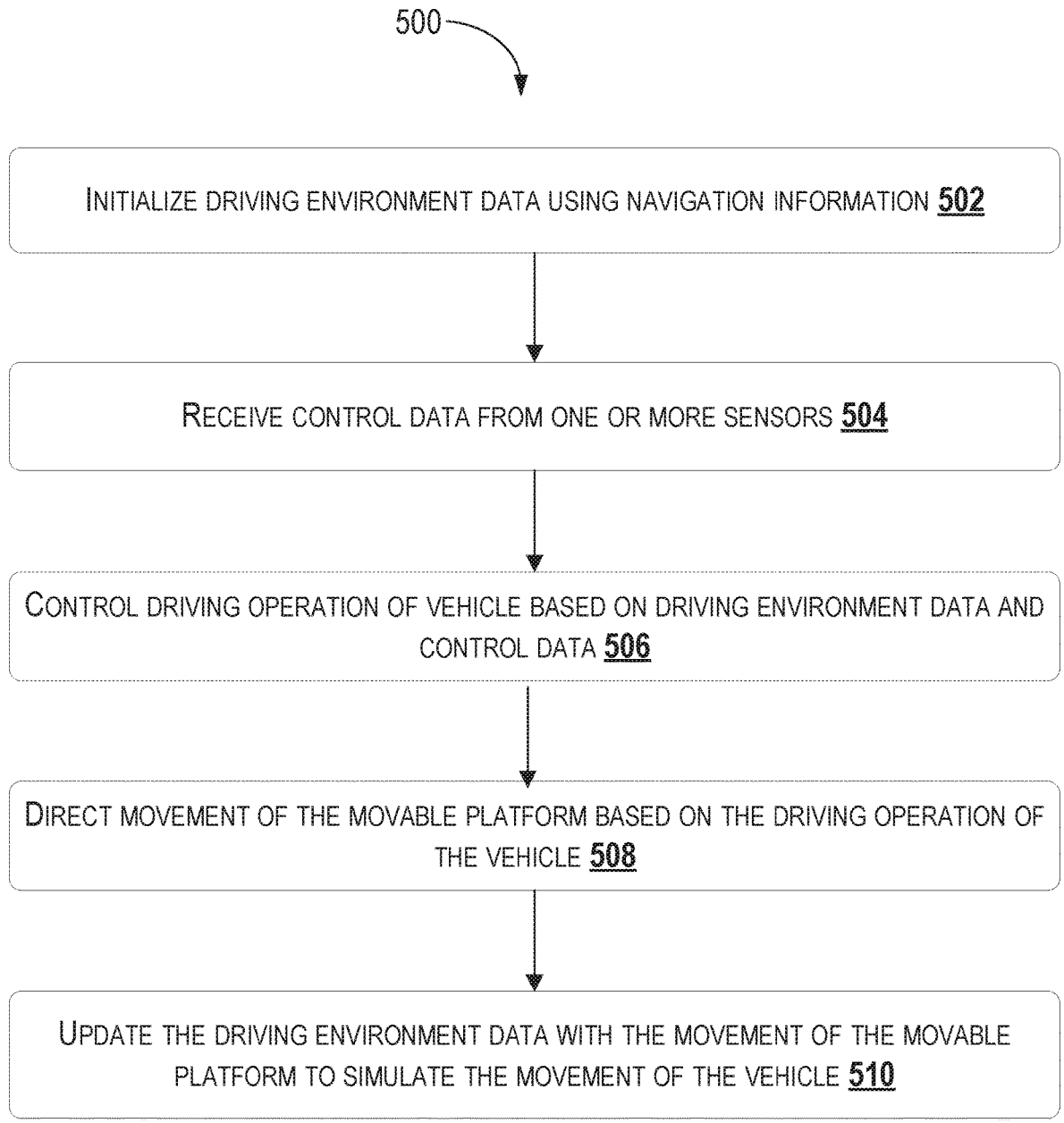
FIG. 5 shows a flowchart illustrating a method for simulating movement of an autonomous vehicle placed on a movable platform, in accordance with some embodiments of the present disclosure.

FIG. 5 shows a flowchart illustrating an method 500 for simulating movement of an autonomous vehicle placed on a movable platform, in accordance with some embodiments of the present disclosure. The method 500 may include one or more operations/modules as illustrated by steps 502-510, which represent operations as may be performed in a method, functional modules in a device.

In FIG. 5, steps 502-510 are illustrated as being performed sequentially, with step 502 first and step 510 last. It will be appreciated however that these steps may be re-arranged as convenient to suit particular embodiments and that these steps or portions thereof may be performed concurrently in some embodiments. It will also be appreciated that in some examples various steps may be eliminated, divided into additional steps, and/or combined with other steps.

At step 502, a driving environment data is initialized using navigation information associated with the autonomous vehicle 104. In some embodiments, initializing the driving environment data includes pre-setting a global positioning system (GPS) location of the autonomous vehicle 104 and simulating the driving environment data for the pre-set GPS location onto one or more display devices 108 located around the autonomous vehicle 104.

At step 504, the control data from the one or more sensors is received. In one embodiment, the one or more sensors include image sensors capable of capturing the driving environment data rendered on the one or more display devices 108. In other embodiments, the sensors may be provided earlier captured data by an actual vehicle that has traveled the street or route being displayed. The sensor readings may be provided electronically in various ways, such as but not limited to, wired or wireless.

At step 506, the driving operation of autonomous vehicle 104 is controlled based on driving environment data and control data. In various embodiments, the control data affecting the operation of the autonomous vehicle 104 includes information of static and moving objects/obstacle, road surface conditions, traffic signal information, and other related data.

At step 508, the movement of the movable platform is directed based on the driving operation of the vehicle. In various embodiments, directing the movement of the movable platform 106 includes detecting at least one of a varied speed and direction of movement of the autonomous vehicle 104, and actuating the movement of the movable platform 106 based on the detected at least one of speed and direction of movement of the autonomous vehicle 104. In one embodiment, the direction of movement of the autonomous vehicle 104 includes at least one of forward and reverse direction movement and one of uphill, downhill, and tiled direction movement.

At step 510, the driving environment data is updated using the movement of the movable platform 106 to emulate the movement of the autonomous vehicle 104. In one embodiment, the updated driving environment data is used in real-time by the autonomous vehicle 104. The driving environment data as it relates to GPS location may be changed or updated even though the actual GPS location of the autonomous vehicle 104 may not change because it is on the platform.

Thus, the present disclosure emulates the actual movement of the autonomous vehicle 104 using the movable platform 106 to train the driving operation of the autonomous vehicle 104 in the real traffic environment. Simulating the movement of the movable platform 106 in the virtual traffic environment to train the autonomous vehicle 104 has improved time efficiency, compared to the training the autonomous vehicle 104 driving operation in the real traffic environment.

The foregoing description of the present invention has been provided for the purposes of illustration and description. It is not intended to be exhaustive or to limit the invention to the precise forms disclosed. The breadth and scope of the present invention should not be limited by any of the above-described exemplary embodiments. Many modifications and variations will be apparent to the practitioner skilled in the art. The modifications and variations include any relevant combination of the disclosed features. The embodiments were chosen and described in order to best explain the principles of the invention and its practical application, thereby enabling others skilled in the art to understand the invention for various embodiments and with various modifications that are suited to the particular use contemplated. It is intended that the scope of the invention be defined by the following claims and their equivalence.

Hardware Implementation

The techniques described herein are implemented by one or more special-purpose computing devices. The special-purpose computing devices may be hard-wired to perform the techniques, or may include circuitry or digital electronic devices such as one or more application-specific integrated circuits (ASICs) or field programmable gate arrays (FPGAs) that are persistently programmed to perform the techniques, or may include one or more hardware processors programmed to perform the techniques pursuant to program instructions in firmware, memory, other storage, or a combination. Such special-purpose computing devices may also combine custom hard-wired logic, ASICs, or FPGAs with custom programming to accomplish the techniques. The special-purpose computing devices may be desktop computer systems, server computer systems, portable computer systems, handheld devices, networking devices or any other device or combination of devices that incorporate hard-wired and/or program logic to implement the techniques.

Computing device(s) are generally controlled and coordinated by operating system software, such as iOS, Android, Chrome OS, Windows XP, Windows Vista, Windows 7, Windows 8, Windows 10, Windows Server, Windows CE, Unix, Linux, SunOS, Solaris, iOS, Blackberry OS, VxWorks, or other compatible operating systems. In other embodiments, the computing device may be controlled by a proprietary operating system. Known operating systems control and schedule computer processes for execution, perform memory management, provide file system, networking, I/O services, and provide a user interface functionality, such as a graphical user interface ("GUI"), among other things.

Figure 6:
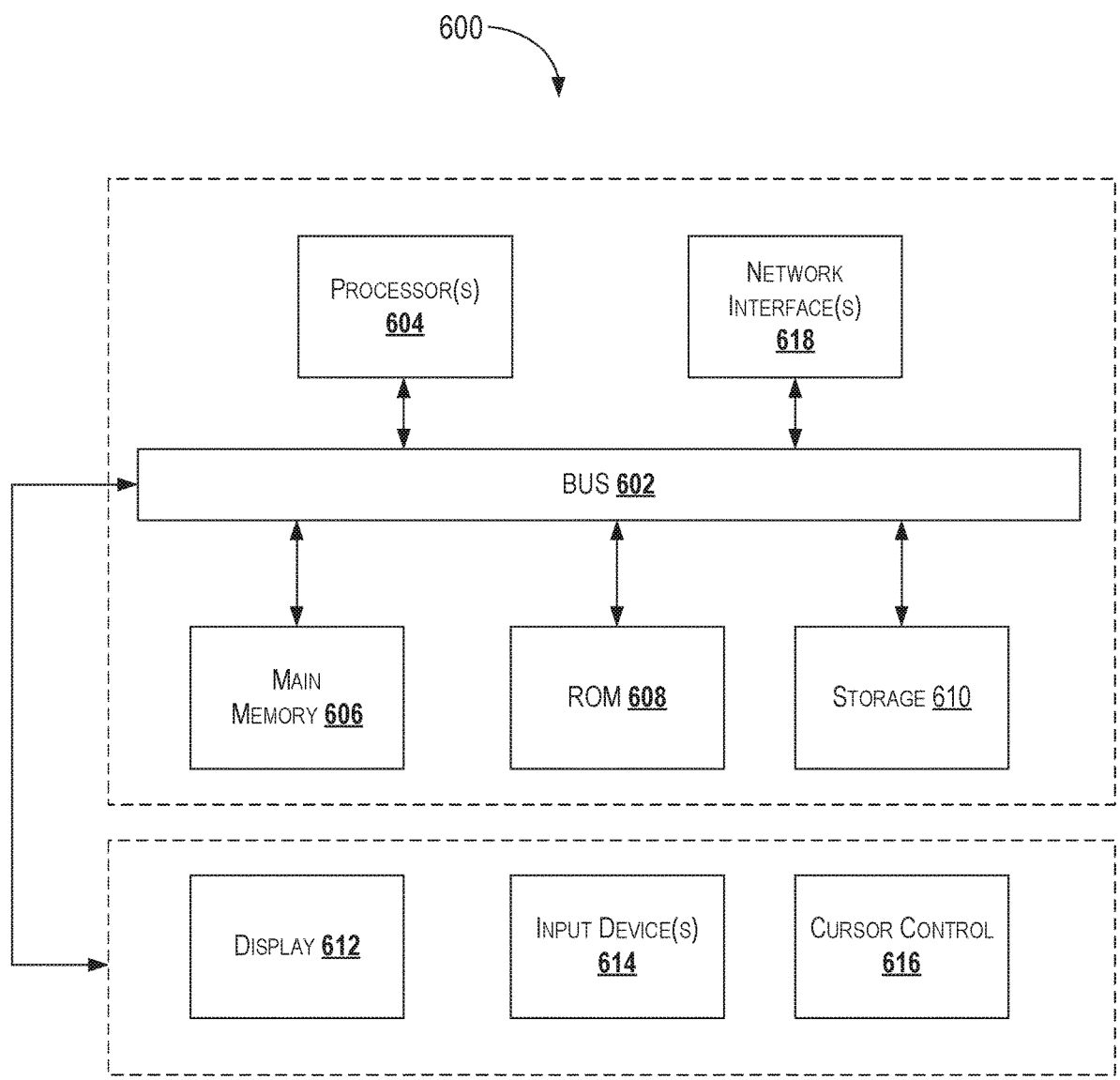
FIG. 6 is a block diagram illustrating a computer system upon which any of the embodiments described herein may be implemented.

FIG. 6 is a block diagram that illustrates a computer system 600 upon which any of the embodiments described herein may be implemented. The computer system 600 includes a bus 602 or other communication mechanism for communicating information, one or more processor 604 coupled with bus 602 for processing information. Processor 604 may be, for example, one or more general purpose microprocessors.

The computer system 600 also includes a main memory 606, such as a random-access memory (RAM), cache and/or other dynamic storage devices, coupled to bus 602 for storing information and instructions to be executed by processor 604. Main memory 606 also may be used for storing temporary variables or other intermediate information during execution of instructions to be executed by processor 604. Such instructions, when stored in storage media accessible to processor 604, render computer system 600 into a special-purpose machine that is customized to perform the operations specified in the instructions.

The computer system 600 further includes a read only memory (ROM) 608 or other static storage device coupled to bus 602 for storing static information and instructions for processor 604. A storage device 610, such as a magnetic disk, optical disk, or USB thumb drive (Flash drive), etc., is provided and coupled to bus 602 for storing information and instructions.

The computer system 600 may be coupled via bus 602 to output device(s) or display 612, such as a cathode ray tube (CRT) or LCD display (or touch screen), for displaying information to a computer user. Input device(s) 614, including alphanumeric and other keys, are coupled to bus 602 for communicating information and command selections to processor 604. Another type of user input device is cursor control 616, such as a mouse, a trackball, or cursor direction keys for communicating direction information and command selections to processor 604 and for controlling cursor movement on display 612. This input device typically has two degrees of freedom in two axes, a first axis (e.g., x) and a second axis (e.g., y), that allows the device to specify positions in a plane. In some embodiments, the same direction information and command selections as cursor control may be implemented via receiving touches on a touch screen without a cursor.

The computer system 600 may include a user interface module to implement a GUI that may be stored in a mass storage device as executable software codes that are executed by the computing device(s). This and other modules may include, by way of example, components, such as software components, object-oriented software components, class components and task components, processes, functions, attributes, procedures, subroutines, segments of program code, drivers, firmware, microcode, circuitry, data, databases, data structures, tables, arrays, and variables.

In general, the word "module," as used herein, refers to logic embodied in hardware or firmware, or to a collection of software instructions, possibly having entry and exit points, written in a programming language, such as, for example, Java, C or C++. A software module may be compiled and linked into an executable program, installed in a dynamic link library, or may be written in an interpreted programming language such as, for example, BASIC, Perl, or Python. It will be appreciated that software modules may be callable from other modules or from themselves, and/or may be invoked in response to detected events or interrupts. Software modules configured for execution on computing devices may be provided on a computer readable medium, such as a compact disc, digital video disc, flash drive, magnetic disc, or any other tangible medium, or as a digital download (and may be originally stored in a compressed or installable format that requires installation, decompression or decryption prior to execution). Such software code may be stored, partially or fully, on a memory device of the executing computing device, for execution by the computing device. Software instructions may be embedded in firmware, such as an EPROM. It will be further appreciated that hardware modules may be comprised of connected logic units, such as gates and flip-flops, and/or may be comprised of programmable units, such as programmable gate arrays or processors. The modules or computing device functionality described herein are preferably implemented as software modules but may be represented in hardware or firmware. Generally, the modules described herein refer to logical modules that may be combined with other modules or divided into sub-modules despite their physical organization or storage.

The computer system 600 may implement the techniques described herein using customized hard-wired logic, one or more ASICs or FPGAs, firmware and/or program logic which in combination with the computer system causes or programs the computer system 600 to be a special-purpose machine. According to one embodiment, the techniques herein are performed by computer system 600 in response to processors 604 executing one or more sequences of one or more instructions contained in main memory 606. Such instructions may be read into main memory 606 from another storage medium, such as storage device 610. Execution of the sequences of instructions contained in main memory 606 causes processor 604 to perform the process steps described herein. In alternative embodiments, hard-wired circuitry may be used in place of or in combination with software instructions.

The term "non-transitory media," and similar terms, as used herein refers to any media that store data and/or instructions that cause a machine to operate in a specific fashion. Such non-transitory media may comprise non-volatile media and/or volatile media. Non-volatile media includes, for example, optical or magnetic disks, such as storage device 610. Volatile media includes dynamic memory, such as main memory 606. Common forms of non-transitory media include, for example, a floppy disk, a flexible disk, hard disk, solid state drive, magnetic tape, or any other magnetic data storage medium, a CD-ROM, any other optical data storage medium, any physical medium with patterns of holes, a RAM, a PROM, and EPROM, a FLASH-EPROM, NVRAM, any other memory chip or cartridge, and networked versions of the same.

Non-transitory media is distinct from but may be used in conjunction with transmission media. Transmission media participates in transferring information between non-transitory media. For example, transmission media includes coaxial cables, copper wire and fiber optics, including the wires that comprise bus 602. Transmission media can also take the form of acoustic or light waves, such as those generated during radio-wave and infra-red data communications.

Various forms of media may be involved in carrying one or more sequences of one or more instructions to processor 604 for execution. For example, the instructions may initially be carried on a magnetic disk or solid state drive of a remote computer. The remote computer can load the instructions into its dynamic memory and send the instructions over a telephone line using a modem. A modem local to computer system 600 can receive the data on the telephone line and use an infra-red transmitter to convert the data to an infra-red signal. An infra-red detector can receive the data carried in the infra-red signal and appropriate circuitry can place the data on bus 602. Bus 602 carries the data to main memory 606, from which processor 604 retrieves and executes the instructions. The instructions received by main memory 606 may retrieves and executes the instructions. The instructions received by main memory 606 may optionally be stored on storage device 610 either before or after execution by processor 604.

The computer system 600 also includes a communication interface 618 coupled to bus 602. Communication interface 618 provides a two-way data communication coupling to one or more network links that are connected to one or more local networks. For example, communication interface 618 may be an integrated services digital network (ISDN) card, cable modem, satellite modem, or a modem to provide a data communication connection to a corresponding type of telephone line. As another example, communication interface 618 may be a local area network (LAN) card to provide a data communication connection to a compatible LAN (or WAN component to communicated with a WAN). Wireless links may also be implemented. In any such implementation, communication interface 618 sends and receives electrical, electromagnetic or optical signals that carry digital data streams representing various types of information.

A network link typically provides data communication through one or more networks to other data devices. For example, a network link may provide a connection through local network to a host computer or to data equipment operated by an Internet Service Provider (ISP). The ISP in turn provides data communication services through the world wide packet data communication network now commonly referred to as the "Internet". Local network and Internet both use electrical, electromagnetic or optical signals that carry digital data streams. The signals through the various networks and the signals on network link and through communication interface 618, which carry the digital data to and from computer system 600, are example forms of transmission media.

The computer system 600 can send messages and receive data, including program code, through the network(s), network link and communication interface 618. In the Internet example, a server might transmit a requested code for an application program through the Internet, the ISP, the local network and the communication interface 618.

The received code may be executed by processor 604 as it is received, and/or stored in storage device 610, or other non-volatile storage for later execution.

Each of the processes, methods, and algorithms described in the preceding sections may be embodied in, and fully or partially automated by, code modules executed by one or more computer systems or computer processors comprising computer hardware. The processes and algorithms may be implemented partially or wholly in application-specific circuitry.

The various features and processes described above may be used independently of one another or may be combined in various ways. All possible combinations and sub-combinations are intended to fall within the scope of this disclosure. In addition, certain method or process blocks may be omitted in some implementations. The methods and processes described herein are also not limited to any particular sequence, and the blocks or states relating thereto can be performed in other sequences that are appropriate. For example, described blocks or states may be performed in an order other than that specifically disclosed, or multiple blocks or states may be combined in a single block or state. The example blocks or states may be performed in serial, in parallel, or in some other manner. Blocks or states may be added to or removed from the disclosed example embodiments. The example systems and components described herein may be configured differently than described. For example, elements may be added to, removed from, or rearranged compared to the disclosed example embodiments.

Conditional language, such as, among others, "can," "could," "might," or "may," unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Any process descriptions, elements, or blocks in the flow diagrams described herein and/or depicted in the attached figures should be understood as potentially representing modules, segments, or portions of code which include one or more executable instructions for implementing specific logical functions or steps in the process. Alternate implementations are included within the scope of the embodiments described herein in which elements or functions may be deleted, executed out of order from that shown or discussed, including substantially concurrently or in reverse order, depending on the functionality involved, as would be understood by those skilled in the art.

It should be emphasized that many variations and modifications may be made to the above-described embodiments, the elements of which are to be understood as being among other acceptable examples. All such modifications and variations are intended to be included herein within the scope of this disclosure. The foregoing description details certain embodiments of the embodiment. It will be appreciated, however, that no matter how detailed the foregoing appears in text, the embodiment can be practiced in many ways. As is also stated above, it should be noted that the use of particular terminology when describing certain features or aspects of the embodiment should not be taken to imply that the terminology is being re-defined herein to be restricted to including any specific characteristics of the features or aspects of the embodiment with which that terminology is associated. The scope of the embodiment should therefore be construed in accordance with the appended claims and any equivalents thereof.

Engines, Components, and Logic

Certain embodiments are described herein as including logic or a number of components, engines, or mechanisms. Engines may constitute either software engines (e.g., code embodied on a machine-readable medium) or hardware engines. A "hardware engine" is a tangible unit capable of performing certain operations and may be configured or arranged in a certain physical manner. In various example embodiments, one or more computer systems (e.g., a standalone computer system, a client computer system, or a server computer system) or one or more hardware engines of a computer system (e.g., a processor or a group of processors) may be configured by software (e.g., an application or application portion) as a hardware engine that operates to perform certain operations as described herein.

In some embodiments, a hardware engine may be implemented mechanically, electronically, or any suitable combination thereof. For example, a hardware engine may include dedicated circuitry or logic that is permanently configured to perform certain operations. For example, a hardware engine may be a special-purpose processor, such as a Field-Programmable Gate Array (FPGA) or an Application Specific Integrated Circuit (ASIC). A hardware engine may also include programmable logic or circuitry that is temporarily configured by software to perform certain operations. For example, a hardware engine may include software executed by a general-purpose processor or other programmable processor. Once configured by such software, hardware engines become specific machines (or specific components of a machine) uniquely tailored to perform the configured functions and are no longer general-purpose processors. It will be appreciated that the decision to implement a hardware engine mechanically, in dedicated and permanently configured circuitry, or in temporarily configured circuitry (e.g., configured by software) may be driven by cost and time considerations.

Accordingly, the phrase "hardware engine" should be understood to encompass a tangible entity, be that an entity that is physically constructed, permanently configured (e.g., hardwired), or temporarily configured (e.g., programmed) to operate in a certain manner or to perform certain operations described herein. As used herein, "hardware-implemented engine" refers to a hardware engine. Considering embodiments in which hardware engines are temporarily configured (e.g., programmed), each of the hardware engines need not be configured or instantiated at any one instance in time. For example, where a hardware engine comprises a general-purpose processor configured by software to become a special-purpose processor, the general-purpose processor may be configured as respectively different special-purpose processors (e.g., comprising different hardware engines) at different times. Software accordingly configures a particular processor or processors, for example, to constitute a particular hardware engine at one instance of time and to constitute a different hardware engine at a different instance of time.

Hardware engines can provide information to, and receive information from, other hardware engines. Accordingly, the described hardware engines may be regarded as being communicatively coupled. Where multiple hardware engines exist contemporaneously, communications may be achieved through signal transmission (e.g., over appropriate circuits and buses) between or among two or more of the hardware engines. In embodiments in which multiple hardware engines are configured or instantiated at different times, communications between such hardware engines may be achieved, for example, through the storage and retrieval of information in memory structures to which the multiple hardware engines have access. For example, one hardware engine may perform an operation and store the output of that operation in a memory device to which it is communicatively coupled. A further hardware engine may then, at a later time, access the memory device to retrieve and process the stored output. Hardware engines may also initiate communications with input or output devices, and can operate on a resource (e.g., a collection of information).

The various operations of example methods described herein may be performed, at least partially, by one or more processors that are temporarily configured (e.g., by software) or permanently configured to perform the relevant operations. Whether temporarily or permanently configured, such processors may constitute processor-implemented engines that operate to perform one or more operations or functions described herein. As used herein, "processor-implemented engine" refers to a hardware engine implemented using one or more processors.

Similarly, the methods described herein may be at least partially processor-implemented, with a particular processor or processors being an example of hardware. For example, at least some of the operations of a method may be performed by one or more processors or processor-implemented engines. Moreover, the one or more processors may also operate to support performance of the relevant operations in a "cloud computing" environment or as a "software as a service" (SaaS). For example, at least some of the operations may be performed by a group of computers (as examples of machines including processors), with these operations being accessible via a network (e.g., the Internet) and via one or more appropriate interfaces (e.g., an Application Program Interface (API)).

The performance of certain of the operations may be distributed among the processors, not only residing within a single machine, but deployed across a number of machines. In some example embodiments, the processors or processor-implemented engines may be located in a single geographic location (e.g., within a home environment, an office environment, or a server farm). In other example embodiments, the processors or processor-implemented engines may be distributed across a number of geographic locations.

Language

Throughout this specification, plural instances may implement components, operations, or structures described as a single instance. Although individual operations of one or more methods are illustrated and described as separate operations, one or more of the individual operations may be performed concurrently, and nothing requires that the operations be performed in the order illustrated. Structures and functionality presented as separate components in example configurations may be implemented as a combined structure or component. Similarly, structures and functionality presented as a single component may be implemented as separate components. These and other variations, modifications, additions, and improvements fall within the scope of the subject matter herein.

Although an overview of the subject matter has been described with reference to specific example embodiments, various modifications and changes may be made to these embodiments without departing from the broader scope of embodiments of the present disclosure. Such embodiments of the subject matter may be referred to herein, individually or collectively, by the term "invention" merely for convenience and without intending to voluntarily limit the scope of this application to any single disclosure or concept if more than one is, in fact, disclosed.

The embodiments illustrated herein are described in sufficient detail to enable those skilled in the art to practice the teachings disclosed. Other embodiments may be used and derived therefrom, such that structural and logical substitutions and changes may be made without departing from the scope of this disclosure. The Detailed Description, therefore, is not to be taken in a limiting sense, and the scope of various embodiments is defined only by the appended claims, along with the full range of equivalents to which such claims are entitled.

It will be appreciated that an "engine," "system," "data store," and/or "database" may comprise software, hardware, firmware, and/or circuitry. In one example, one or more software programs comprising instructions capable of being executable by a processor may perform one or more of the functions of the engines, data stores, databases, or systems described herein. In another example, circuitry may perform the same or similar functions. Alternative embodiments may comprise more, less, or functionally equivalent engines, systems, data stores, or databases, and still be within the scope of present embodiments. For example, the functionality of the various systems, engines, data stores, and/or databases may be combined or divided differently.

"Open source" software is defined herein to be source code that allows distribution as source code as well as compiled form, with a well-publicized and indexed means of obtaining the source, optionally with a license that allows modifications and derived works.

The data stores described herein may be any suitable structure (e.g., an active database, a relational database, a self-referential database, a table, a matrix, an array, a flat file, a documented-oriented storage system, a non-relational No-SQL system, and the like), and may be cloud-based or otherwise.

As used herein, the term "or" may be construed in either an inclusive or exclusive sense. Moreover, plural instances may be provided for resources, operations, or structures described herein as a single instance. Additionally, boundaries between various resources, operations, engines, engines, and data stores are somewhat arbitrary, and particular operations are illustrated in a context of specific illustrative configurations. Other allocations of functionality are envisioned and may fall within a scope of various embodiments of the present disclosure. In general, structures and functionality presented as separate resources in the example configurations may be implemented as a combined structure or resource. Similarly, structures and functionality presented as a single resource may be implemented as separate resources. These and other variations, modifications, additions, and improvements fall within a scope of embodiments of the present disclosure as represented by the appended claims. The specification and drawings are, accordingly, to be regarded in an illustrative rather than a restrictive sense.

Conditional language, such as, among others, "can," "could," "might," or "may," unless specifically stated otherwise, or otherwise understood within the context as used, is generally intended to convey that certain embodiments include, while other embodiments do not include, certain features, elements and/or steps. Thus, such conditional language is not generally intended to imply that features, elements and/or steps are in any way required for one or more embodiments or that one or more embodiments necessarily include logic for deciding, with or without user input or prompting, whether these features, elements and/or steps are included or are to be performed in any particular embodiment.

Although various embodiments have been described in detail for the purpose of illustration based on what is currently considered to be the most practical and preferred implementations, it is to be understood that such detail is solely for that purpose and that the invention is not limited to the disclosed implementations, but, on the contrary, is intended to cover modifications and equivalent arrangements that are within the spirit and scope of the appended claims. For example, it is to be understood that the present disclosure contemplates that, to the extent possible, one or more features of any embodiment can be combined with one or more features of any other embodiment.

What is claimed is:

1. A method for simulating a driving operation of a vehicle, the method comprising:
   initializing, by a processor, driving environment data using navigation information associated with the vehicle;
   receiving, by the processor, control data from one or more sensors, wherein the control data affects driving operation of the vehicle;
   controlling the driving operation of the vehicle based on the driving environment data and the control data received;
   detecting at least one of a varied speed and direction of movement of the vehicle, based on the driving operation of the vehicle controlled to emulate the movement of the vehicle; and
   actuating the movement of a movable platform on which the vehicle is placed, based on the detected at least one of speed and direction of movement of the vehicle, wherein:
   the direction of movement of the vehicle includes linear and angular direction movement of the vehicle,
   the linear direction movement is one of forward and reverse direction movement, and
   the angular direction movement includes one of uphill, downhill, and tilted direction movement.

2. The method of claim 1, further comprising updating the driving environment data with the movement of the movable platform to emulate the movement of the vehicle in real time.

3. The method of claim 1, wherein initializing the driving environment data comprises:
   pre-setting a GPS location of the vehicle; and
   simulating the driving environment data for the GPS location onto one or more display devices located around the vehicle.

4. The method of claim 3, further comprising dynamically updating the GPS location based on the driving operation of the vehicle and a navigation information obtained from a high definition map of the vehicle.

5. The method of claim 3, wherein the one or more sensors include image sensors capable of capturing the driving environment data rendered on the one or more display devices, wherein the driving environment data include geographical information associated with each GPS location of the vehicle.

6. The method of claim 1, wherein the control data affecting the operation of the vehicle includes information of static and moving objects/obstacle, road surface conditions, traffic signal information, and other related data.

7. The method of claim 1, wherein controlling the driving operation of the vehicle includes varying at least one of a speed and a direction of movement of the vehicle based on the driving environment data and the control data.

8. The method of claim 1, wherein the movable platform includes a base platform and a plurality of flexible legs coupled to the base platform, wherein the base platform and the plurality of flexible legs are capable of moving in accordance with the detected at least one of speed and direction of movement of the vehicle.

9. A system to emulate movement of a vehicle placed on a movable platform, the system comprises:
   a plurality of processors; and
   a memory storing instructions that, when executed by the plurality of processors, cause the system to perform:
      initialize a driving environment data using navigation information associated with the vehicle;
      receive control data from one or more sensors, wherein the control data affects driving operation of the vehicle;
      control the driving operation of the vehicle based on the driving environment data and the control data received; and
      direct movement of the movable platform on which the vehicle is placed, based on the driving operation of the vehicle controlled to emulate the movement of the vehicle, wherein:
         the movable platform includes a base platform and a plurality of flexible legs couple to the base platform, and
         the base platform and the plurality of flexible legs are capable of moving in accordance with a detected at least one of speed and direction of movement of the vehicle.

10. The system of claim 9, further comprises update the driving environment data with the movement of the movable platform to emulate the movement of the vehicle in real time.

11. The system of claim 9, wherein initialize the driving environment data comprises:
   pre-set a global positioning system (GPS) location of the vehicle; and
   emulate the driving environment data for the GPS location onto one or more display devices located around the vehicle.

12. The system of claim 11, further comprises dynamically update the GPS location based on the driving operation of the vehicle and navigation information obtained from a high definition map of the vehicle.

13. The system of claim 11, wherein the one or more sensors include image sensors capable of capturing the driving environment data rendered on the one or more display devices, wherein the driving environment data include geographical information associated with each GPS location of the vehicle.

14. The system of claim 9, wherein the control data that affects the operation of the vehicle includes information of static and moving objects/obstacle, road surface conditions, traffic signal information, and other related data.

15. The system of claim 9, wherein control the driving operation of the vehicle includes vary at least one of a speed and a direction of movement of the vehicle based on the driving environment data and the control data.

16. The system of claim 9, wherein direct the movement of the movable platform comprises:
   detect at least one of a varied speed and direction of movement of the vehicle; and
   actuate the movement of the movable platform based on the detected at least one of speed and direction of movement of the vehicle,
   wherein the direction of movement of the vehicle includes linear and angular direction movement of the vehicle, wherein the linear direction movement is one of forward and reverse direction movement, and angular direction movement includes one of uphill, downhill, and tilted direction movement.

17. A non-transitory computer readable medium comprising instructions that, when executed, cause one or more processors to perform:
   initializing a driving environment data using navigation information associated with a vehicle;
   receiving control data from one or more sensors, wherein the control data affects driving operation of the vehicle;
   controlling a driving operation of the vehicle based on the driving environment data and the control data received;
   detecting at least one of a varied speed and direction of movement of the vehicle, based on the driving operation of the vehicle controlled to emulate the movement of the vehicle; and
   actuating the movement of a movable platform on which the vehicle is placed, based on the detected at least one of speed and direction of movement of the vehicle, wherein:
      the direction of movement of the vehicle includes linear and angular direction movement of the vehicle,
      the linear direction movement is one of forward and reverse direction movement, and
      the angular direction movement includes one of uphill, downhill, and tilted direction movement.

18. The non-transitory computer readable medium of claim 17, further comprises updating the driving environment data with the movement of the movable platform to emulate the movement of the vehicle in real time.

19. The non-transitory computer readable medium of claim 17, wherein initializing the driving environment data comprises:
   pre-setting a GPS location of the vehicle; and
   simulating the driving environment data for the GPS location onto one or more display devices located around the vehicle.

20. The non-transitory computer readable medium of claim 19, further comprising dynamically updating the GPS location based on the driving operation of the vehicle and a navigation information obtained from a high definition map of the vehicle.

* * * * *